United States Patent

[11] 3,569,736

[72] Inventor John Tschinkel
Great Neck, N.Y.

[21] Appl. No. 780,136
[22] Filed Nov. 29, 1968
[45] Patented Mar. 9, 1971
[73] Assignee The United States of America as represented by the Secretary of the Navy

[54] TEMPERATURE COMPENSATED LOGARITHMIC CONVERTER UTILIZING THE EXPONENTIAL TRANSFER FUNCTION OF A SEMICONDUCTOR DIODE JUNCTION

2 Claims, 2 Drawing Figs.

[52] U.S. Cl. .......... 307/230, 307/229, 328/145
[51] Int. Cl. .......... G06g 7/12
[50] Field of Search .......... 307/229, 230; 328/145; 235/150.53, 197, 193.5

[56] References Cited

UNITED STATES PATENTS 3,374,361 3/1968 Callis .......... 307/229
3,465,168 9/1969 Luhowy et al. .......... 307/230

*Primary Examiner*—Donald D. Forrer
*Assistant Examiner*—B.P. Davis
*Attorneys*—Edgar J. Brower and H. H. Losche

ABSTRACT: A logarithmic converter circuit for providing an output voltage proportional to the logarithm of an applied input voltage, having novel temperature compensation means for stabilizing the effects of ambient temperature upon a semiconductor diode utilized as the nonlinear converting element. The converter is comprised of a PN-junction semiconductor diode arranged to utilize its exponential forward impedance characteristic for providing the desired logarithmic transfer function in a manner well known in the art, and a novel temperature compensating arrangement including a second, matched semiconductor diode and an operational amplifier having unity gain and at least one noninverting input terminal coupled in circuit with the diode converting element to control its biasing voltage in such manner that the undesired effect of ambient temperature upon its forward impedance characteristic is practically eliminated.

PATENTED MAR 9 1971 3,569,736

INVENTOR
JOHN TSCHINKEL

BY H. H. Losche
ATTORNEY

TEMPERATURE COMPENSATED LOGARITHMIC CONVERTER UTILIZING THE EXPONENTIAL TRANSFER FUNCTION OF A SEMICONDUCTOR DIODE JUNCTION

BACKGROUND OF THE INVENTION

This invention is in the field of electronic nonlinear signal converter systems, and more specifically in the area of temperature compensation for a converter which utilizes the temperature dependent, exponential forward impedance characteristic of a semiconductor diode junction to provide an output signal which is logarithmically related to an applied input signal.

It has been known for many years that the junction voltage of a semiconductor PN-junction diode is a logarithmic function of the junction current. This forward impedance characteristic of the diode junction of such semiconductors has enabled the device to find utility in electrical circuits which are required to provide an output voltage proportional to the logarithm of the input voltage. Such circuits are often used in electronic analogue computing devices and various instrumentation where electrical quantities are to be indicated on a decibel or other logarithmic scale.

The idealized PN-junction current-voltage relationship may be expressed by the following equation:

$$I=I_s(expl1)$$

where $I$ is the total current of the idealized PN-junction diode, $I_s$ represents the diode saturation current, $q$ is the magnitude of the electronic charge, $V$ is the voltage drop, $k$ represents Boltzmann's constant, and $T$ is the absolute temperature. Thus it may be seen that the diode equation contains the absolute temperature explicitly in the exponent $qV/kT$; and although not apparent from this equation, the saturation current $I_s$ also contains six parameters which are temperature dependent. This temperature dependence of the idealized diode junction characteristic is very undesirable, and unless proper compensation can be provided for changes in the ambient temperature of the diode, it will be unsuitable for use as a logarithmic converter in many applications including the above-mentioned analogue computing devices and instrumentation circuitry. The book entitled Physical Electronics and Circuit Models of Transistors, Semiconductor Electronics Education Committee Series, Volume 2, by Gray, DeWitt, Boothroyd, and Gibbons, (John Wiley and Sons, Inc., New York, 1964) discusses in Chapter 3, Section 3.3, the above diode equation and the temperature dependence of the diode characteristics.

This need for temperature compensation of the PN-junction when utilized as a logarithmic converter has long been recognized by those skilled in the art, and various means for providing this necessary compensation are disclosed in the prior art. For example, an article entitled "The Application Of Some Semiconductors As Logarithmic Elements," by N. M. Schaeffer and G. W. Wood (Proc. I.R.E., Vol. 42, pp. 1113-—1116, 1954), discloses the use of negative temperature coefficient resistance (NTC) units for this purpose. Also, U.S. Pat. No. 3,308,271, issued Mar. 7, 1967, to D. F. Hilbiber discloses three transistors, mounted on a common heat sink, of which a transistor 11 (see FIGS. 1 and 2) is coupled as the diode logarithmic element. A transistor 13, to serve as a thermal heating unit for maintaining the common heat sink at a constant temperature in order to prevent ambient temperature changes in the logarithmic element 11, is coupled in circuit with a temperature sensing transistor 14 and a differential amplifier 29. Transistor 14 and resistances 26, 27, and 28 form a comparison bridge for comparing a voltage proportional to the junction temperature of transistor 14 which, in turn, is proportional to the temperature of the common heat sink, with a reference potential, for producing a control potential which causes the thermal heating transistor 13 to maintain the common heat sink at the desired temperature by adding heat as required.

Other forms of temperature compensated logarithmic amplifiers are disclosed in U.S. Pat. No. 3,329,836, issued Jul. 4, 1967, to A. R. Pearlman and W. D. Miller. This patent discloses, in FIGS. 1 and 2, two forms of a logarithmic amplifier, each employing a high gain, inverting, operational amplifier having a feedback loop including two serially coupled transistors of opposite conductivity type therein. These serially coupled transistors in the feedback loop must be of the opposite conductivity, while being otherwise matched, in order that the changes in potential across each transistor due to ambient temperature changes will be equal in magnitude and opposite in polarity to produce a net effect across the series pair feedback loop of canceling the effect of temperature changes. The series pair serve as the logarithmic element, and being in the feedback path, cause the high gain, inverting operational amplifier to produce an amplified output signal at terminals 30 which is logarithmically related to the input signal applied to terminals 26.

The present invention provides novel means of temperature compensation for a PN-junction diode logarithmic converter which is believed to provide more accurate compensation than the NTC resistance units of Schaeffer and Wood while being more economical to construct and less complicated than the Hilbiber and Pearlman et al. devices.

SUMMARY OF THE INVENTION

The present invention provides novel temperature compensation means in a PN-junction diode logarithmic converter circuit in order to stabilize the effects of ambient temperature upon the diode converter element. The temperature compensated converter circuit includes first PN-junction semiconductor diode which serves as the logarithmic converting element. Its exponential forward impedance characteristic is utilized to provide the desired logarithmic transfer function in a manner well known in the art. The temperature compensation means is comprised of a second PN-junction diode whose characteristics are matched with those of the diode converting element over the range of ambient temperatures to be encountered by the device, an operational amplifier having unity gain and a noninverting input terminal, and a direct current biasing source. This second diode, the direct current biasing source, and the unity gain operational amplifier establish the bias point of the diode converting element and adjust this bias point as necessary to compensate for changes in the diode converting element forward impedance characteristic due to changes in the ambient temperature. The diode converting element and the second matching diode are mounted in any suitable manner for exposing them to the same ambient temperature environment, such as mounting on a common heat sink and/or common encapsulation in a heat conducting material, or other means well known in the art. The direct current source is coupled to establish a bias potential across the second matching diode. Noninverting input means of the unity gain operational amplifier are coupled across the second matching diode. The unity gain operational amplifier, therefore, establishes at its output terminal, a bias potential equal to that established by direct current source across the second matching diode. This bias potential from the operational amplifier is coupled across a resistance in series with the diode converting element to provide the necessary biasing potential for establishing the desired bias current flow therethrough. This bias current flow through the PN-junction of the diode converting element must be maintained constant throughout the range of ambient temperatures to be encountered by the device if the circuit is to be useful as a logarithmic converter.

As the ambient temperature changes, the forward impedance characteristics of the two matched diodes change, and in the absence of temperature compensation means, the bias current flow through the diode converting element would change accordingly. However, the temperature compensation means adjusts the bias potential across the diode converting element in an amount which effectively counteracts the change in its forward impedance due to the change in ambient temperature, so that the net result is to maintain constant the bias current flow through the converting element, thereby stabilizing the logarithmic converter circuit.

BRIEF DESCRIPTION OF THE DRAWING

The objects and attendant advantages, features, and uses of the invention will become apparent from the following detailed description when considered in conjunction with the accompanying FIGS. of drawing wherein.

DESCRIPTION OF THE PREFERRED EMBODIMENT

Figure 1:
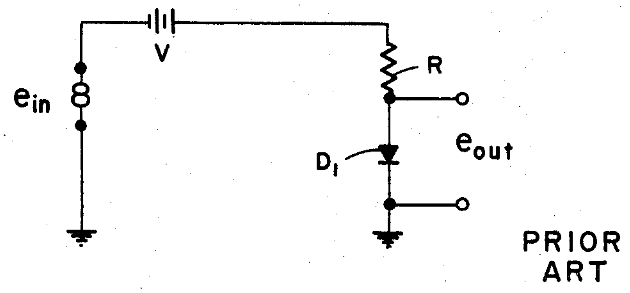
FIG. 1 represents an uncompensated logarithmic converter circuit of the prior art, utilizing a PN-junction semiconductor diode as the logarithmic converting element.

Referring more particularly to FIG. 1, there is shown a prior art logarithmic converter circuit without temperature compensation, in which a PN-junction semiconductor diode $D_1$ is utilized as the converter element to produce an output signal $e_{out}$ which is logarithmically related to the input signal $e_{in}$. The direct current potential source $V$ and the resistance $R$ establish the bias point of the temperature dependence of the idealized diode junction characteristic, changes in the ambient temperature of the diode $D_1$ change the forward impedance of the diode junction resulting in changes in the diode current and, consequently, the output signal $e_{out}$ with respect to the input signal $e_{in}$. Thus it may be seen that the uncompensated diode logarithmic converter circuit of FIG. 1 is unsuitable for use in applications where ambient temperature is subject to change.

Figure 2:
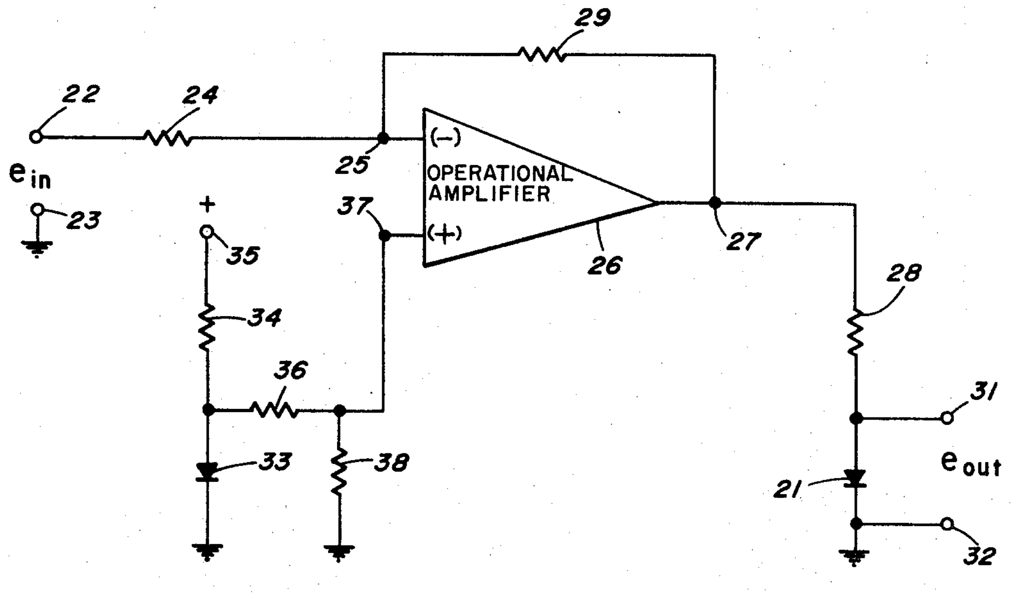
FIG. 2 depicts a schematic embodiment of the temperature compensated logarithmic converter circuit of the present invention.

Referring now to FIG. 2, there is shown a schematic representation of the temperature compensated logarithmic converter circuit of the present invention in which a PN-junction semiconductor diode is utilized as the logarithmic converter element. A pair of input terminals 22 and 23 are provided for receiving the variable input signal $e_{in}'$ terminal 23 being coupled to ground potential and terminal 22 being coupled via an input resistance 24 to the inverting input terminal 25 of an operational amplifier 26. The output terminal 27 of operational amplifier 26 is coupled via a resistance 28 to the anode electrode of converting diode 21. A pair of output terminals 31 and 32 are coupled across diode 21 for providing thereat an output signal logarithmically related to the input signal applied across input terminals 22 and 23. A resistance 29 is coupled between output terminal 27 and input terminal 25 of operational amplifier 26. A second PN-junction semiconductor diode 33, having characteristics matching those of diode 21 over the expected ambient temperature range of the device, has its anode electrode coupled via a resistance 34 to a source of positive direct current potential 35 and via a resistance 36 to the noninverting input terminals 37 of operational amplifier 26, while its cathode electrode is coupled to ground potential. A resistance 38 is coupled between terminal 37 and ground potential.

In the selection and operation of converter diode 21, it should be ascertained that (1) the maximum expected output signal $e_{out}$ across terminals 31—32 will be within the exponential region of the particular diode forward current characteristics, (2) the direct current bias potential across the diode is maintained at a level such that the forward bias current through the diode is always much greater than the diode saturation current ($I_{bias} >> I_s$), and (3) the desired overall signal transfer dynamics of the circuit are possible. Also, as previously indicated, diodes 21 and 33 are to be a matched pair, at least over the ambient temperature range to which the device will be exposed. Diodes 21 and 33 should be mounted on a common heat sink, or encapsulated in a heat conducting material, or otherwise mounted so as to be exposed to the same ambient temperature environment.

The following TABLE I lists suitable values for various elements and components shown in FIG. 2 of the drawing. While these examples of suitable values for the various elements and components are provided herein, it is to be understood that they are in no way to limit the invention hereto, as other values and components of like nature may be utilized to accomplish similar results.

Table I

Diodes 21 and 33—Selected pn-junction semiconductor matched pair.
Resistance 24—4,120 ohms.
Resistance 28—1,000 ohms.
Resistance 29—10,000 ohms.
Resistance 34—115,000 ohms.
Resistance 36—10,000 ohms.
Resistance 38—4,120 ohms.
Operational amplifier 26—Selected, with inverting and non-inverting inputs and high input impedance.
Positive direct current potential source 35—12 volts.

OPERATION

The operation of the temperature compensated logarithmic converter comprising the invention occurs in the following manner. With reference to FIG. 2 of the drawing it will be assumed that positive direct current potential source 35 has established a bias potential via resistance 34 across diode 33. This bias potential across diode 33 is presented to the high impedance input terminal 37 of unity gain operational amplifier 26 via resistance 36. Since resistance 38 is a high resistance and terminal 37 presents a high input impedance, for all practical purposes there is no current flow through resistance 36 and the potential established between amplifier input terminal 37 and ground is effectively the same as that established across diode 33. Operational amplifier 26 has unity gain. Therefore, the potential established between the output terminal 27 of the amplifier 26 and ground potential will be the same as that established across diode 33 by the constant current potential source 35. This direct current potential established between amplifier output terminal 27 and ground provides the necessary bias potential (corresponding to bias source $V$ of FIG. 1) for producing the desired bias current flow through resistance 28 and logarithmic converting diode 21. This bias current flow through resistance 28 and the PN-junction of diode converting element 21 must be maintained constant throughout the range of ambient temperatures to be encountered by the device if it is to be useful as a logarithmic converter The present invention maintains this bias current flow through resistance 28 and diode 21 at a constant level throughout the ambient temperature range of the device by automatically varying the level of the bias potential between amplifier terminal 27 and ground, as necessary, to compensate for changes in the voltage drop across diode 21 due to changes in the ambient temperature.

For purposes of explanation of the operation of the invention as shown in FIG. 2, the following symbols are intended to represent the various direct current potentials between stated points:

$E_{21}$ DC bias potential across diode 21, at some ambient temperature $T$ $E_{33}$ DC bias potential across diode 33, at temperature $T$ $E_{27}$ DC bias potential present between output terminal 27 of amplifier 26 and ground, at temperature $T$ $E_{28}$ DC voltage drop across resistance 28 due to the level of DC bias current flow through resistance 28 and diode 21 established by $E_{27}$, at temperature $T$ $\Delta E_{21}$ change in DC bias potential across diode 21 due to a change in the ambient temperature from $T$ to $T \pm \Delta T$ $\Delta E_{33}$ change in DC bias potential across diode 33 due to change in the ambient temperature from $T$ to $T \pm \Delta T$ It will be readily recognized by those skilled in the art from observation of FIG. 2 that the following DC relationships exist:

At ambient temperature $T$, $E_{27} = E_{28} + E_{21}$ $E_{28}=E_{27}-E_{21}$

Therefore, the bias current flow ($I_{bias}$) through resistance 28 and diode 21 at temperature $T$ may be expressed as:

$$I_{\text{bias, T}}=\frac{E_{28}}{R_{28}}=\frac{E_{27}-E_{21}}{R_{28}}$$

where $R_{28}$ represents the ohmic value of resistance 28. The invention maintains this current flow constant over the ambient temperature range of the device, thereby compensating for the effect of ambient temperature changes upon the forward impedance characteristics of the diode converting element 21, in the following manner.

As the ambient temperature $T$ increases to $T+\Delta T$, the DC potential $E_{21}$ across diode 21 becomes $E_{21}-\Delta E_{21}$. Since diodes 21 and 33 are a matched pair and are mounted so as to share a common thermal environment, the change in ambient temperature from $T$ to $T+\Delta T$ will cause a simultaneous, equal decrease in the DC potential $E_{33}$ across diode 33, i.e., $\Delta E_{21}=\Delta E_{33}$ for any change in their ambient temperature $T$. Thus at temperature $T+\Delta T$, the DC potential across diode 33 is $E_{33}-\Delta E_{33}$DC potential between output terminal 27 of unity gain amplifier 26 and ground is determined by, and equal to, the DC potential across diode 33, without regard to ambient temperature. Therefore, the DC potential between amplifier terminal 27 and ground at temperature $T$ is $E_{33}$, and at temperature $T+\Delta T$ is $E_{33}-\Delta E_{33}$.

As shown above the bias current flow through resistance 28 and diode 21 at temperature $T$ may be expressed as:

$$I_{\text{bias, T}}=\frac{E_{28}}{R_{28}}=\frac{E_{27}-E_{21}}{R_{28}}$$

and since $E_{27}=E_{33}$ at temperature $T$, $$I_{\text{bias, T}}=\frac{E_{33}-E_{21}}{E_{28}}$$

The bias current flow through resistance 28 and diode 21 at temperature $T+\Delta T$ may be expressed as:

$$I_{\text{bias, T}+\Delta\text{T}}=\frac{(E_{33}-\Delta E_{33})-(E_{21}-\Delta E_{21})}{R_{28}}$$

$$I_{\text{bias, T}+\Delta\text{T}}=\frac{E_{33}-E_{21}-\Delta E_{33}+\Delta E_{21}}{R_{28}}$$

and since $$\Delta E_{21}=\Delta E_{33},$$

$$I_{\text{bias, T}+\Delta\text{T}}=\frac{E_{33}-E_{21}-\Delta E_{21}+\Delta E_{21}}{R_{28}}=\frac{E_{33}-E_{21}}{R_{28}}$$

Thus, it has been shown that the DC bias current flow through resistance 28 and diode 21 at an ambient temperature $T$ is equal to the DC bias current flow therethrough at a temperature $T+\Delta T$. In a like manner, it may be shown that this DC bias current flow through diode 21 will be held constant at this same level, for a decrease in ambient temperature ($T-\lambda\Delta T$) also.

Matching diode 33, potential source 35, and unity gain operational amplifier 26 cooperate to maintain this DC bias current flow constant through diode converting element 21, in spite of changes in the forward impedance of diode 21 because of changes in its ambient temperature. By maintaining this bias current flow through diode 21 at this constant level, the logarithmic relationship between the output signal $e_0$ taken from terminals 31—32 and the input signal $e_{in}$ applied to input terminals 22—23 will not be affected by changes in the ambient temperature surrounding the diode converting element 21.

Thus it may be seen, in view of the foregoing explanation and FIGS. of drawing, that the invention, a temperature compensated logarithmic converter circuit, is a useful and necessary device having utility in electronic analogue computing devices and various logarithmic instrumentation circuitry.

While many modifications may be made in the disclosed embodiment of the invention by utilizing different values or by replacing various elements and components with equivalent structures, it is to be understood that I desire to be limited in the spirit of my invention only by the scope of the appended claims.

I claim:

1. A temperature compensated logarithmic converter circuit comprising:
 a first semiconductor diode having an anode and a cathode electrode for utilizing as a logarithmic converting element, said cathode electrode being coupled to ground potential;
 a first resistance means having one terminal thereof coupled to said anode electrode of said first semiconductor diode;
 a unity gain operational amplifier having an output terminal means, and first and second input terminal means with said second input terminal being noninverting, said output terminal means being coupled to the other terminal of said first resistance means;
 input terminal means, for receiving a variable input signal, resistively coupled to said first input terminal means of said operational amplifier;
 a source of direct current potential;
 a second semiconductor diode having an anode and a cathode electrode and having characteristics matching those of said first semiconductor diode, said cathode electrode thereof being coupled to ground potential, and said anode electrode thereof being resistively coupled by a first path to said source of direct current potential and by a second path to said second input terminal means of said operational amplifier; and
 output terminal means coupled across said first semiconductor diode for providing thereat an output signal which is logarithmically related to said variable input signal.

2. A temperature compensated logarithmic converter circuit as set forth in claim 1 wherein said first semiconductor diode and said second semiconductor diode share a common thermal environment.

PO-1050
(5/69)

UNITED STATES PATENT OFFICE
CERTIFICATE OF CORRECTION
UNDER RULE 322

Patent No. 3,569,736 Dated March 9, 1971

Inventor(s) JOHN TSCHINKEL

It is certified that error appears in the above-identified patent and that said Letters Patent are hereby corrected as shown below:

Column 1, line 27, change:

"$I = I_s$(expl 1)"

To read:

$I = I_s(\exp^{qV/kT} - 1)$

Column 1, lines 49 and 50, change:

"PN-junction when utilized as a"

To read:

PN-junction diode when utilized as a

Column 2, line 31, change:

"circuit includes first PN-junction"

To read:

circuit includes a first PN-junction

Column 3, lines 24 and 25, change:

"of the idealized diode junction:

To read:

of the logarithmic converting diode $D_1$. However, because of the idealized diode junction Column 3, line 37, change:

"diode is utilized"

To read:

diode 21 is utilized

Column 5, line 21, change:

"diode 33 is $E_{33}$ $-\Delta E_{33}$ DC potential"

PO-1050
(5/69)

UNITED STATES PATENT OFFICE
CERTIFICATE OF CORRECTION
UNDER RULE 322 (Continued)

Patent No. 3,569,736 Dated March 9, 1971

PAGE- 2

Inventor(s) JOHN TSCHINKEL

It is certified that error appears in the above-identified paten and that said Letters Patent are hereby corrected as shown below:

To read:

diode 33 is $E_{33} - \Delta E_{33}$. As previously indicated, for all practical purposes the D. C. potential Column 5, lines 36 through 39, change equation:

"$I_{bias,\ T} = \frac{E_{33} - E_{21}}{E_{28}}$"

To read:

$I_{bias,\ T} = \frac{E_{33} - E_{21}}{R_{28}}$

Column 6, lines 2 and 3, change:

"temperature (T- λT) also."

To read:

temperature (T - ΔT) also.

Column 6, Claim 1, line 30, change (Amendment filed 8-6-

"electrode for utilizing as a logarithmic"

To read:

electrode for utilization as a logarithmic

Signed and sealed this 7th day of September 1971.

(SEAL)

Attest:

EDWARD M.FLETCHER,JR.
Attesting Officer

ROBERT GOTTSCHALK
Acting Commissioner of P